United States Patent [19]

Wada

[11] Patent Number: 5,075,736
[45] Date of Patent: Dec. 24, 1991

[54] SUPERCONDUCTING THREE TERMINAL DEVICE WITH COMPONENT MEMBERS CROSSING AT FINITE ANGLES AND FORMED OF SUPERCONDUCTOR SUCH AS NIOBIUM, ALUMINIUM

[75] Inventor: Yoshifusa Wada, Tokyo, Japan

[73] Assignee: NEC Corporation, Tokyo, Japan

[21] Appl. No.: 507,747

[22] Filed: Apr. 12, 1990

[30] Foreign Application Priority Data

Apr. 13, 1989 [JP] Japan .................................. 1-94537

[51] Int. Cl.$^5$ ..................... H01L 27/12; H01L 39/22; H01L 39/12; H01B 12/00
[52] U.S. Cl. ........................................... 357/4; 357/5; 505/1
[58] Field of Search ........................... 357/4, 5; 505/1

[56] References Cited

U.S. PATENT DOCUMENTS

| | | | |
|---|---|---|---|
| 4,621,203 | 11/1986 | Sweeny .................................. | 357/5 |
| 4,768,069 | 8/1988 | Talvacchio et al. ..................... | 357/5 |
| 4,831,421 | 5/1989 | Gallagher et al. ...................... | 357/4 |
| 4,907,861 | 3/1990 | Muto ...................................... | 357/4 |

FOREIGN PATENT DOCUMENTS 64-21974  1/1989  Japan ..................................... 357/5

OTHER PUBLICATIONS

Blamire et al., "Microstructure Effects on Electronic Properties of Nb/Al$_2$O$_3$/Nb Tunnel Junctions", *J. Appl. Phys.*, vol. 64 (11), Dec. 1, 1988, pp. 6396–6405.

"A New Macroscopic Quantum Effect in Josephson Junctions-Possible to Operate a Device via Single Electron Transfer!", Yoshihiro et al., understood to be Articles of Ouyou Buturi Gakkai, vol. 56, No. 8, pp. 1040–1046 (1987), together with an English language translation thereof.

"Bloch Oscillations in Small Josephson Junctions: Possible Fundamental Standard of DC Current and Other Applications", Likharev et al., IEEE Transactions on Magnetics, vol. MAG-21, No. 2, Mar. 1985, pp. 943–946.

"Single-Electron Transistors: Electrostatic Analogs of the DC Squids", Likharev, IEEE Transactions on Magnetics, vol. MAG-23, No. 2, Mar. 1987, pp. 1142–1145.

"Observation of Single-Electron Charging Effects in Small Tunnel Junctions", Fulton and Dolan, Physical Review Letters, vol. 59, No. 1, Jul. 1987, pp. 109–112.

"Articles of Ouyou Buturi Gakkai", vol. 56, No. 8, pp. 1040–1046, (1987).

"Dynamics of Josephson Junctions and Circuits", Likharev, Gordon and Breach Science Publishers, Cover Page, Table of Contents, pp. vii–xi and pp. 540–565.

Primary Examiner—Andrew J. James
Assistant Examiner—Daniel N. Russell
Attorney, Agent, or Firm—Burns, Doane, Swecker & Mathis

[57] ABSTRACT

A superconducting three terminal device is fabricated on a substrate, and comprises first and second output signal electrodes formed of a superconductor and provided on the major surface of the substrate at a spacing, the first and second output signal electrodes having respective side surfaces, and a base electrode formed of a superconductor and provided on the first and second output signal electrodes so that ultra-small tunnel junctions takes place between the base electrode and the first and second output signal electrodes, the base electrode having a side surface, in which the first and second output signal electrodes and the base electrode are grown in first, second and third directions respectively coincident with directions of thicknesses thereof and in which the side surfaces of the first and second output signal electrodes and the base electrode are substantially perpendicular to the first, second and third directions, respectively, wherein the side surfaces of the first and second output signal electrodes and the side surface of the base electrode are coplanar with respective virtual planes extending at respective finite angles with respect to the major surface of the substrate.

6 Claims, 7 Drawing Sheets

SUPERCONDUCTING THREE TERMINAL DEVICE WITH COMPONENT MEMBERS CROSSING AT FINITE ANGLES AND FORMED OF SUPERCONDUCTOR SUCH AS NIOBIUM, ALUMINIUM

FIELD OF THE INVENTION

This invention relates to a superconducting three terminal device and, more particularly, to the structure of a superconducting three terminal device made feasible by using a semiconductor fabrication technology.

DESCRIPTION OF THE RELATED ART

When a pair of electrodes formed of a superconductor are coupled through a tunneling barrier, it is well known to a person skilled in the art that the Josephson effect takes place therebetween. Moreover, If a junction capacitance of this structure is decreased to a value where the static electric energy ($e^2/2C$) accumulated in a capacitor C is greater than the Josephson coupling energy ($hIc/4\pi e$) and much greater than a thermal energy ($k_BT$), a Bloch oscillation takes place as being reported by K. K. Likharev et al. in "BLOCH OSCILLATIONS IN SMALL JOSEPHSON JUNCTIONS: POSSIBLE FUNDAMENTAL STANDARD OF DC CURRENT AND OTHER APPLICATIONS", IEEE TRANSACTIONS ON MAGNETICS, Vol. MAG-21, No. 2, March 1985, pages 943 to 946. Similar behavior is also theoretically discussed in Articles of Ouyou Buturi Gakkai, Vol. 56, No. 8, 1987, pages 1040 to 1046. In the above mentioned formulae, e is the electric charge of a single electron, h is the Planck constant, and Ic is a critical current at the Josephson junction. The above mentioned papers theoretically discuss discrete tunneling of Copper pairs at the small tunnel junctions.

The small tunnel junctions are available in a superconducting three terminal device, and FIGS. 1 and 2 respectively show the superconducting three terminal devices which are similar in arrangement to the single-electron tunneling transistor circuits proposed by K. K. Likharev in "SINGLE-ELECTRON TRANSISTORS: ELECTROSTATIC ANALOGS OF THE DC SQUIDS", IEEE TRANSACTIONS ON MAGNETICS, Vol. MAG-23, No. 2, March 1987, pages 1142 to 1145. In FIG. 1, the superconducting three terminal device is provided with two small tunnel junctions 1A and 1B arranged in series and respectively coupled to output signal nodes 2A and 2B, and an input signal node 3A is coupled through a capacitor 3B to an intermediate electrode. The small tunnel junctions 5A and 5B are also incorporated in the superconducting three terminal device shown in FIG. 2, and the small tunnel junctions 5A and 5B are coupled to output signal nodes 6A and 6B, respectively. However, an input signal node 7A is coupled to an intermediate electrode through a resister 7B. Although the small tunnel junctions incorporated in the single-electron tunneling transistors proposed by K. K. Likharev are of the ordinary conductive material, the three terminal devices equipped with the small tunnel junctions of a superconductor will be implemented.

According to the paper contained in the Articles of Ouyou Buturi Gakkai, each of the transistors shown in FIG. 1 or 2 is responsive to an input signal applied to the input signal node 3A or 7A, and a critical voltage level, i.e. a voltage level allowing current to pass through the small tunnel junctions 2A and 2B or 6A and 6B, is modulated. If the variation of the critical voltage level is sequentially relayed to the subsequent stage, an active functional circuitry will be implemented. However, no concrete structure of the superconducting three terminal device has been proposed yet.

Concerning the single-electron tunnel transistor circuit, T. A. Fulton and G. J. Dolan propose a structure in "Observation of Single-Electron Charging Effects in Small Tunnel Junctions", PHYSICAL REVIEW LETTERS, Vol. 59. No. 1, July 1987, pages 109 to 112. The structure proposed by Fulton et al. comprises aluminum electrodes and a small electrode which are coupled for formation of two small tunnel junctions at spacing. In the single-electron tunnel transistor thus arranged, the two small tunnel junctions are coupled in series, and a third electrode coupled to the small electrode monitors the modulation of voltage-to-current characteristics due to the single-electron tunneling phenomenon.

As described hereinbefore, any concrete structure of the superconducting three terminal device has not been proposed yet, however, a superconducting three terminal device may be fabricated in a similar manner to the single-electron tunnel transistor illustrated in FIG. 3. The single-electron tunnel transistor illustrated in FIG. 3 is fabricated on a substrate 11, and a small electrode 12A is patterned on the substrate 11. Two output signal lines 13A and 13B are partially overlapped with the small electrode 12 at spacing so that two small tunnel junctions 14A and 14B take place between the output signal lines 13A and 13B and the small electrode 12. The small tunnel junctions 14A and 14B are indicated by hatching for better understanding. An input signal line 15 is also partially overlapped at between the small tunnel junctions 14A and 14B with the small electrode 12, and a capacitor 16 is produced between the input signal line 15 and the small electrode 12 as indicated by hatching. The two output signal lines 13A and 13B as well as the input signal line 15 are patterned through lithographic techniques, and, for this reason, the amount of each overlapped area depends on the precision achieved by the aligner system. This means that the formation of the small tunnel junctions is not exactly controllable in view of fabrication technology currently available. Moreover, when the structure shown in FIG. 3 is fabricated for the superconducting three terminal device, the dimensions of each small tunnel junction 14A or 14B is of the order of sub-micron, and, therefore, the superconducting three terminal device is not currently feasible in the structure shown in FIG. 3, because the precision of an aligner system is currently not so high.

SUMMARY OF THE INVENTION

It is therefore an important object of the present invention to provide a superconducting three terminal device which is reproducible in view of three terminal device characteristics.

It is also an important object of the present invention to provide a process of fabricating a superconducting three terminal device which utilizes semiconductor fabricating technology currently available.

To accomplish these objects, the present invention proposes to employ a deposition so as to adjust the thicknesses of signal output electrodes as well as a base electrode.

In accordance with one aspect of the present invention, there is provided a superconducting three terminal device fabricated on a substrate, the substrate having a major surface, comprising a multi-level gate structure provided on the major surface of the substrate and having a) first and second output signal electrodes formed of a superconductor and spaced apart from each other at a spacing, the first and second output signal electrodes having respective side surfaces, and b) a base electrode formed of a superconductor and contacted to the first and second output signal electrodes so that small tunnel junctions takes place between the base electrode and the first and second output signal electrodes, the base electrode having a side surface, in which the first and second output signal electrodes and the base electrode are grown in first, second and third directions respectively coincident with directions of thicknesses thereof and in which the side surfaces of the first and second output signal electrodes and the base electrode are substantially perpendicular to the first, second and third directions, respectively, wherein the side surfaces of the first and second output signal electrodes and the side surface of the base electrode are coplanar with respective virtual planes extending at respective finite angles with respect to the major surface of the substrate.

In accordance with another aspect of the present invention, there is provided a process of fabricating a superconducting three terminal device, comprising the steps of a) preparing a substrate having a major surface, and b) forming the superconducting three terminal device having first and second output signal electrodes provided on the major surface of the substrate at a spacing and a base electrode provided on the first and second output signal electrodes for producing small tunnel junctions, in which the step b) comprises the sub-steps of b-1) forming at least two lower insulating blocks on the major surface of the substrate, the lower insulating blocks being spaced apart from one another by a first interval, the lower insulating blocks having respective side surfaces, b-2) depositing a superconductor on the entire surface, b-3) removing the superconductor except for the superconductor on the side surfaces of the lower insulating blocks so that lower columns of the superconductor are formed on the side surfaces, respectively, and serve as the first and second output signal electrodes, respectively, b-4) forming a first insulating layer on the major surface of the substrate so that a first smooth upper surface is created, upper surfaces of the lower columns being substantially coplanar with an upper surface of the first insulating layer, b-5) forming at least one upper insulating block on the first smooth upper surface, the upper insulating block having a side surface, b-6) depositing a superconductor on the entire surface, b-7) removing the superconductor except for the superconductor on the side surface of the upper insulating block so that an upper column of the superconductor is formed on the side surface and serves as 6the base electrode, and b-8) forming a second insulating layer on the first smooth upper surface.

In accordance with still another aspect of the present invention, there is provided a process of fabricating a superconducting three terminal device, comprising the steps of a) preparing a substrate having a major surface, and b) forming the superconducting three terminal device having a base electrode provided on the major surface of the substrate and first and second output signal electrodes provided on the base electrode at a spacing, in which the step b) comprises the sub-steps of b-1) forming at least one lower insulating block on the major surface of the substrate, the lower insulating block having a side surface, b-2) depositing a superconductor on the entire surface, b-3) removing the superconductor except for the superconductor on the side surface of the lower insulating block so that a lower column of the superconductor is formed on the side surface and serves as the base electrodes, b-4-) forming a first insulating layer on the major surface of the substrate so that a first smooth upper surface is created, an upper surface of the lower column being substantially coplanar with an upper surface of the first insulating layer, b-5) forming at least two upper insulating blocks on the first smooth upper surface, the upper insulating blocks being spaced apart form each other, the upper insulating blocks having respective side surfaces, b-6) depositing a superconductor on the entire surface, b-7) removing the superconductor except for the superconductor on the side surfaces of the upper insulating blocks so that upper columns of the superconductor are formed on the side surfaces, respectively, and serve as the first and second signal electrodes, respectively, and b-8) forming a second insulating layer on the first smooth upper surface.

BRIEF DESCRIPTION OF THE DRAWINGS

The features and advantages of a superconducting three terminal device and a process of fabrication thereof according to the present invention will be more clearly understood from the following description taken in conjunction with the accompanying drawings in which:

FIGS. 5A to 5C are different in direction of sketching from FIGS. 5D to 5F;

DESCRIPTION OF THE PREFERRED EMBODIMENTS

First Embodiment

Figure 1:
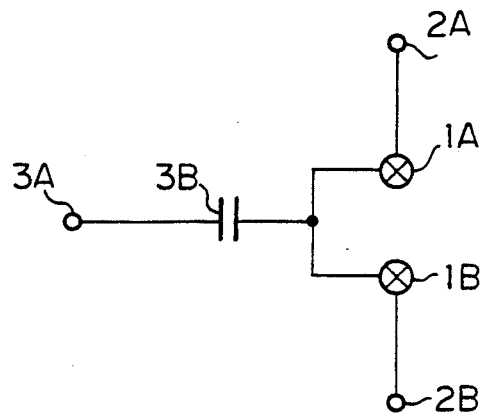
FIG. 1 is a diagram showing a superconducting three terminal device arranged in a similar manner to a prior art single-electron tunnel transistor.
Figure 2:
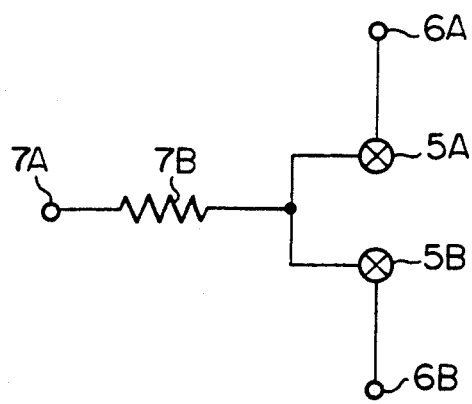
FIG. 2 is a diagram showing a superconducting three terminal device arranged in a similar manner to another prior art single-electron tunnel transistor.
Figure 3:
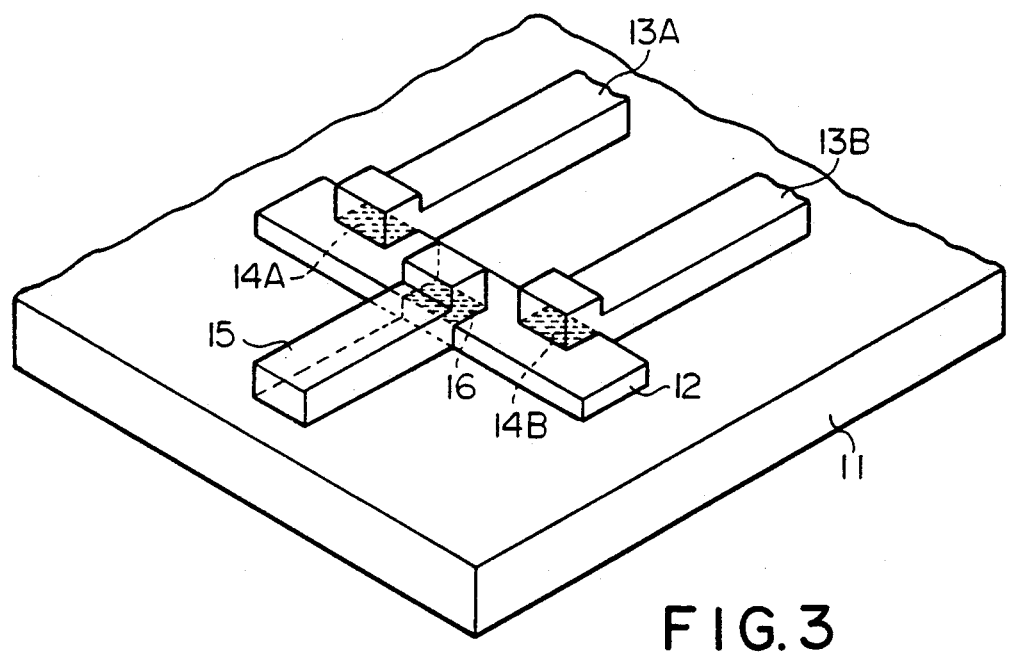
FIG. 3 is a perspective view showing the structure of the prior art single-electron tunnel transistor.
Figure 4:
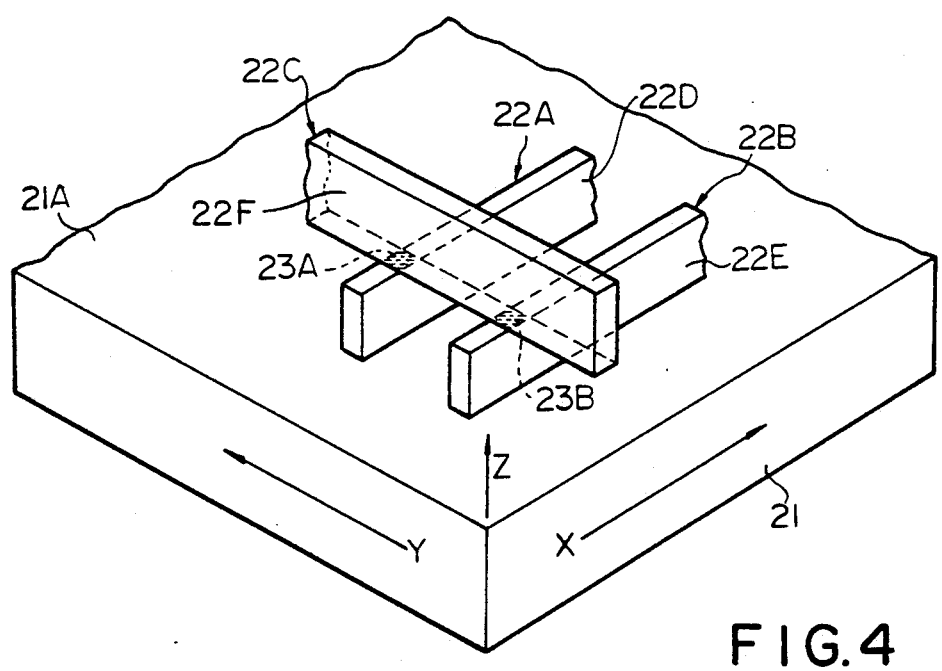
FIG. 4 is a perspective view showing the structure of a superconducting three terminal device according to the present invention.

Referring first to FIG. 4 of the drawings, a superconducting three terminal device embodying the present invention is fabricated on a silicon substrate 21, and three axes of the coordinate defined for the silicon substrate 21 are labeled with X, Y and Z, respectively. The superconducting three terminal device comprises first and second signal output electrodes 22A and 22B and a base electrode 22C, and these electrodes 22A, 22B and 22C are implemented by first, second and third superconducting strips of niobium, respectively. The first and second signal output electrodes 22A and 22B are located at spacing on the major surface 21A of the substrate 21, and the base electrode 22C bridges a gap between the first and second signal output electrodes 322A and 322B. The base electrode 22C thus provided forms first and second small tunnel junctions 23A and 323B together with the first and second signal output electrodes 22A and 22B. The small tunnel junctions 23A and 23B are indicated by hatch lines for better understanding. The first and second signal output electrodes 22A and 22B have respective longitudinal directions substantially parallel to the X axis, and the base electrode 22C has a longitudinal direction substantially parallel to the Y direction. Thus, the first and second signal output electrodes 22A and 22B are provided on virtual planes substantially perpendicular to a virtual plane where the base electrode 22C extends. The superconducting three terminal device fabricated on the silicon substrate 21 is embedded into an insulating film of, for example, silicon dioxide deposited on the major surface 21A of the substrate 21, however, the insulating film is not shown in FIG. 4 for clarifying the structure of the superconducting three terminal device. Though not shown in the drawings, the base electrode 22C is coupled to an input signal line through a capacitor or resistor, and it is desirable for the base electrode 22C to be as small as possible for reduction of signal input loss and, accordingly, preventing the base electrode from deterioration in characteristic impedance.

In this instance, the first, second and third superconducting strips are formed by using a deposition technique followed by a lithographic sequence, and directions in which the first, second and third superconducting strips are grown are hereinbelow referred to as first, second and third directions, respectively. The first and second superconducting strips or the first and second signal output electrodes 22A and 22B have respective side surfaces 22D and 22E substantially normal to the first and second directions, and the side surfaces 22D and 22E are adjusted in such a manner as to be substantially perpendicular to the major surface 21A of the silicon substrate 21. Similarly, the third superconducting strip or the base electrode 22C has a side surface 22F substantially normal to the third direction, and the side surface 22F are coplanar with virtual planes substantially perpendicular to the major surface 21A of the silicon substrate 21. In general, a deposition is much more controllable in view of the thickness of a film rather than a lithographic sequence or, more particularly, than a mask alignment. Then, the thicknesses of the first to third superconducting strips are precisely adjusted to respective target values, and the amount of area of each small tunnel junction 23A or 23B is precisely adjustable to a target value by changing the angle between the longitudinal direction of the base electrode 22C and the longitudinal directions of the signal output electrodes 22A and 22B. For this reason, the dimensions of each of the small tunnel junctions 23A and 23b are controllable on the sub-micron order.

The superconducting three terminal device behaves as similar to that proposed by K.K. Likkarev. Namely, if an input signal is supplied to the base electrode 22C through either capacitor or resistor, a current flowing between the first and second output signal electrodes 22A and 22B is modulated depending upon the amount of electric charges injected from the base electrode 22C. In other words, a current amplification or a switching behavior is controlled by the voltage level of the input signal due to an interaction between the currents flowing between the small tunnel junctions 23A and 23B. This phenomenon is described in detail by Konstantin K. Lkharev in "Dynamics of Josephson Junctions and Circuits" published by Gordon and Breach Science Publishers in 1981, pages 541 to 564.

Figure 5A:
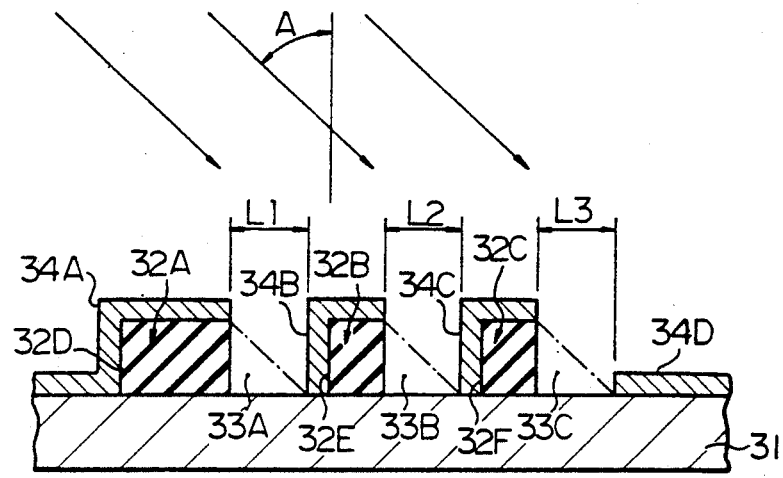
FIGS. 5A to 5F are cross sectional views showing a process sequence for fabricating the superconducting three terminal device shown in FIG. 4; however.
Figure 5B:
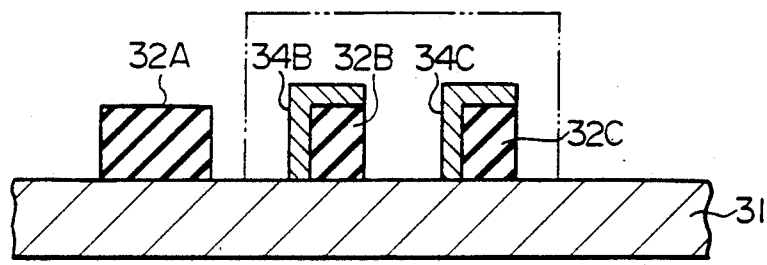
Figure 5C:
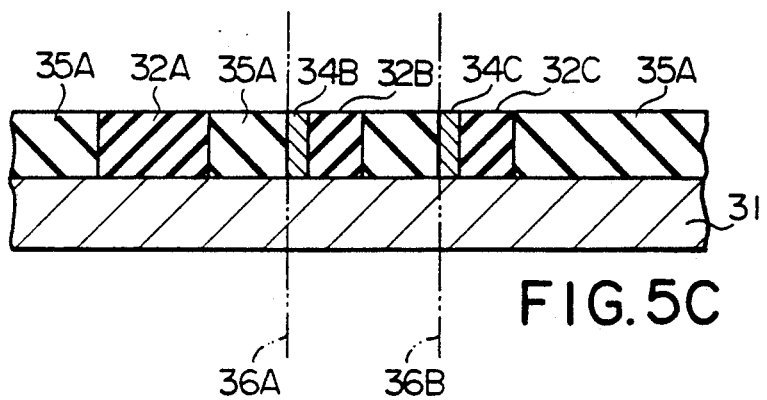
Figure 5D:
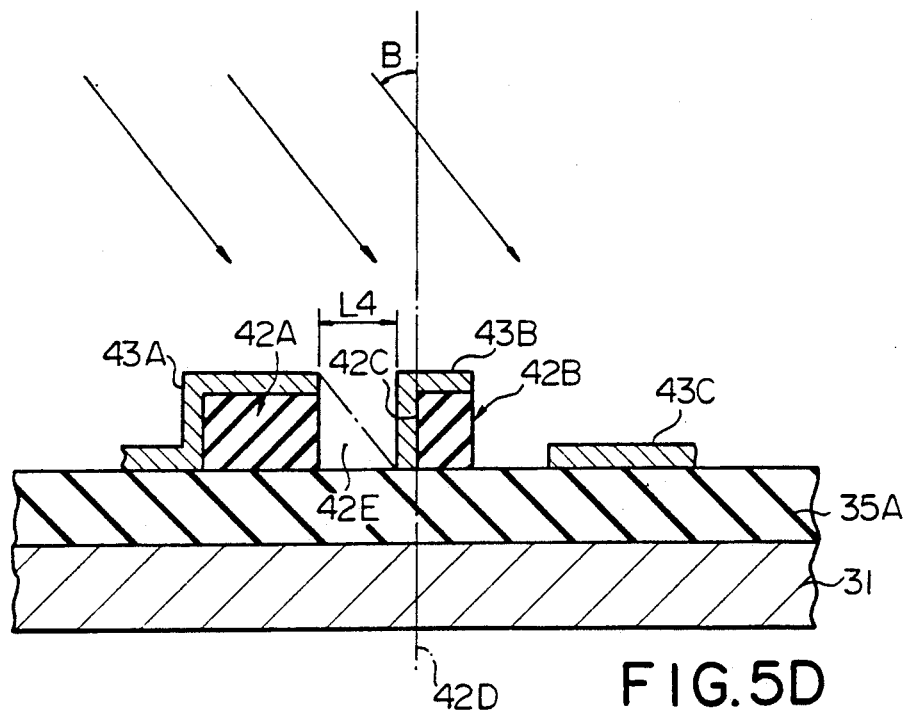
Figure 5E:
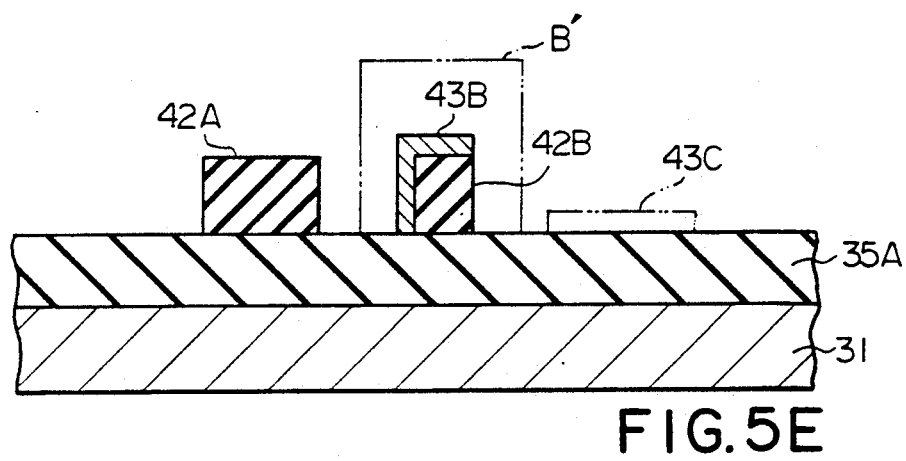
Figure 5F:
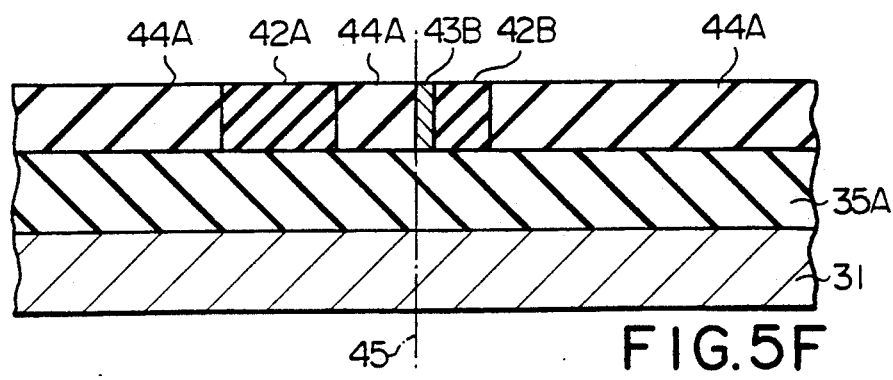

Description is hereinbelow made on a process of fabricating the superconducting three terminal device with reference to FIGS. 5A to 5F. FIGS. 5A to 5C show the structures at early stages in a direction parallel to the axis X of FIG. 4, but FIGS. 5D to 5F show the structures at latter stages in a direction parallel to the axis Y of FIG. 4.

The process starts with preparation of a silicon substrate 31, and an insulating substance such as, for example, silicon dioxide or a magnesium oxide is deposited on the major surface of the silicon substrate 31 by using an electron beam evaporation or a sputtering technique so that an insulating film is grown on the major surface of the silicon substrate 31. On the upper surface of the insulating film thus grown is produce that photoresist mask layer through a lithographic sequence which is used for patterning the insulating film, then insulating blocks 32A, 32B and 32C are formed on the silicon substrate 32. In this instance, a reactive ion etching technique is utilized for formation of the insulating blocks 32A to 32C, and the insulating blocks 32A to 32C have respective side surfaces 32D, 32E and 32F on the respective left sides of the insulating blocks 32A to 32C substantially perpendicular to the major surface of the silicon substrate 31 due to the anisotropic etching. An incidental beam angle A with respect to the side surfaces 32D to 32F is taken into account, and the thickness of the insulating film as well as intervals L1, L2 and L3 are adjusted to respective values in such a manner that no superconducting substance is deposited on the major surface of the silicon substrate 31 in the intervals L1 to L3 because of the shadows 33A, 33B and 33C of the insulating blocks 32A to 32C thrown on the major surface of the silicon substrate 31. After the formation of the insulating blocks 32A to 32C, fluxes of an superconductor such as niobium are incident on the entire surface of the resultant structure at angle A, and the fluxes are constituted by molecular beams of the superconductor and/or cluster beams of the superconductor. Then, superconducting films 34A, 34B, 34C and 34D are deposited to a thickness of about 40 nano-meters on the insulating blocks 32A to 32C and the major surface of the silicon substrate 31 as illustrated in FIG. 5A. The superconducting films 34B and 34C have respective longitudinal directions substantially normal to the sheet where FIGS. 5A to 5C are drawn. In this instance, the incidental beam angle A is adjusted to about 45 degrees, and the height of the insulating blocks 32A to 32C and the intervals L1 to L3 are selected to be about 800 nano-meters. However, the intervals L1 and L3 may range from 10 nano-meters to 1000 nano-meters. The incidental beam angle A, the height of the insulating blocks 32A to 32C and the intervals L1 to L3 thus adjusted are conducive to a uniformity of the superconducting films 34A to 34D in thickness.

A photoresist film is spun onto the entire surface of the structure, and is, then, patterned through a lithographic sequence so that a photoresist mask covers the superconducting films 34B and 34C but exposes the superconducting films 34A and 34D. The side edges of the photoresist mask are fallen within the intervals L1 and L3 as indicated by a phantom line B, and the intervals L1 and L3 are wide enough for the side edges to be fallen thereinto. This results in easy alignment for the photoresist mask. By using the photoresist mask, the superconducting films 34A and 34D are etched away in CF$_4$ at the total pressure of 5 Pa assisted by a high frequency radiation at 0.16 watt per cm$^2$. The etching rate is of the order of 10 nanometers per minute, and, therefore, the superconducting films 34A and 34D are removed in a predetermined time period slightly longer than four minutes. When the superconducting films 34A and 34D are removed from the insulating block 32A and the major surface of the silicon substrate 31, the photoresist mask is stripped off by using a solution of acetone, and the resultant structure of this stage is illustrated in FIG. 5B.

Subsequently, the gaps between the insulating blocks 32A and 32b and the superconducting films 34B and 34C are filled with silicon dioxide 35A. First, silicon dioxide is sputtered to a thickness larger than that of the insulating blocks 32A to 32C in an argon ambient of about 0.22 Pa assisted by a high frequency radiation at 500 watts. The deposition rate is of the order of 40 nano-meters per minute. In this instance, the silicon dioxide film 35A is as thick as about 1 micron. The silicon dioxide film 35A is then subjected to an etch-back treatment using polystyrene, and is uniformly removed until the top surface of the superconducting films 34B and 34C are exposed. In detail, a solution of polystyrene is spun onto the silicon dioxide film 35A, and the polystyrene solution is dried. After the drying stage, a furnace is increased in temperature to about 180 degrees in centigrade, and the substrate 31 is baked in the furnace for about 30 minutes. Then, the polystyrene film melts or reflows in the high temperature ambient, and a smooth surface is created due to a balance between the viscosity as well as the surface tension. This means that topography of the silicon dioxide film 35A is not transferred to the upper surface of the polystyrene film. Then, the polystyrene and the silicon dioxide are etched in such a manner as to be equal in etching rate, and it is desirable for such a uniform etching to create an etching ambient with a gaseous mixture of CF$_4$ and O$_2$ assisted by a high frequency radiation at 0.16 watt per cm$^2$. In this instance, the total pressure of the etchant gaseous mixture is regulated to about 45 Pa, and the partial pressure of oxygen is about 0.45 Pa. Subsequently, a uniform etching is further carried out in an etching ambient where the etching rates to niobium and silicon dioxide are substantially equal to each other. In this instance, the etchant gaseous mixture contains CF$_4$ and O$_2$ at about 10 Pa, and the partial pressure of oxygen is regulated to about 1 Pa. A high frequency radiation at 0.16 watt per cm$^2$ assists the etching. The resultant structure of this stage is illustrated in FIG. 5C, and the superconducting films 34B and 34C serves as the signal output electrodes 22A and 22B. Reference numerals 36A and 36B designate respective virtual planes with which respective side surfaces of the superconducting films 34B and 34C are coplanar.

The formation of the base electrode 22C follows. Namely, an insulating substance such as, for example, silicon dioxide or a magnesium oxide is deposited on the entire surface by using an electron beam evaporation or a sputtering technique so that an insulating film is grown thereon. On the upper surface of the insulating film thus grown is produce a photoresist mask layer through a lithographic sequence which is used for patterning the insulating film, then insulating blocks 42A and 42B are formed partially on the silicon dioxide film 35A and partially on the superconducting films 34B and 34C. In this instance, a reactive ion etching technique is utilized for formation of the insulating blocks 42A and 42B, and the insulating block 42B has a side surface 42C on the left side of the insulating block 42B coplanar with a virtual plane 42D substantially perpendicular to the major surface of the silicon substrate 31 due to the anisotropic etching. An incidental beam angle B with respect to the virtual plane 42D is taken into account, and the thickness of the insulating film as well as an interval L4 are adjusted to respective values in such a manner that no superconducting substance is deposited on the major surface of the silicon substrate 31 in the interval L4 because of the shadows 42E of the insulating block 42A. After the formation of the insulating blocks 42A and 42B, fluxes of an superconductor such as niobium are incident on the entire surface of the resultant structure at angle B, and superconducting films 43A, 43B and 43C are deposited to a thickness of about 40 nano-meters on the insulating blocks 42A and 42B and on the silicon dioxide film 35A as illustrated in FIG. 5D. The superconducting film 43B is in contact with the upper surfaces of the superconducting films 34A and 34B, and extends in a longitudinal direction substantially perpendicular to the longitudinal directions of the superconducting films 34B and 34C. The longitudinal direction of the superconducting film 43B is substantially normal to the sheet where FIGS. 5D to 5F are drawn. In this instance, the incidental beam angle B is adjusted to about 45 degrees, and the height of the insulating blocks 42A and 42B and the interval L4 are selected to be about 800 nano-meters. The incidental beam angle B, the height of the insulating blocks 42A and 42B and the interval L4 thus adjusted are conducive to a uniformity of the superconducting film 43B in thickness.

A photoresist film is spun onto the entire surface of the structure, and is, then, patterned through a lithographic sequence so that a photoresist mask (which is indicated by phantom line B) covers the superconducting film 43B but exposes the superconducting films 43A and 43C. Alignment for the photoresist mask is easy as similar to that of the superconducting films 34B and 34C. By using the photoresist mask, the superconducting films 43A and 43C are etched away in CF$_4$ at the total pressure of 5 Pa assisted by a high frequency radiation at 0.16 watt per cm$^2$. The etching rate is of the order of 10 nano-meters per minute, and, therefore, the superconducting films 43A and 43C are removed in a predetermined time period slightly longer than four minutes. When the superconducting films 43A and 43C are removed, the photoresist mask is stripped off by using a solution of acetone, and the resultant structure of this stage is illustrated in FIG. 5E.

Subsequently, the gap between the insulating block 42A and the superconducting film 43B and 34C is filled with silicon dioxide. The etch back treatment is applied again, and detailed description is omitted for the sake of simplicity. The superconducting film 43B serves as the base electrode 22C, and has a side surface coplanar with a virtual plane 45 extending substantially perpendicular to the major surface of the silicon substrate 31.

Second Embodiment

Figure 6:
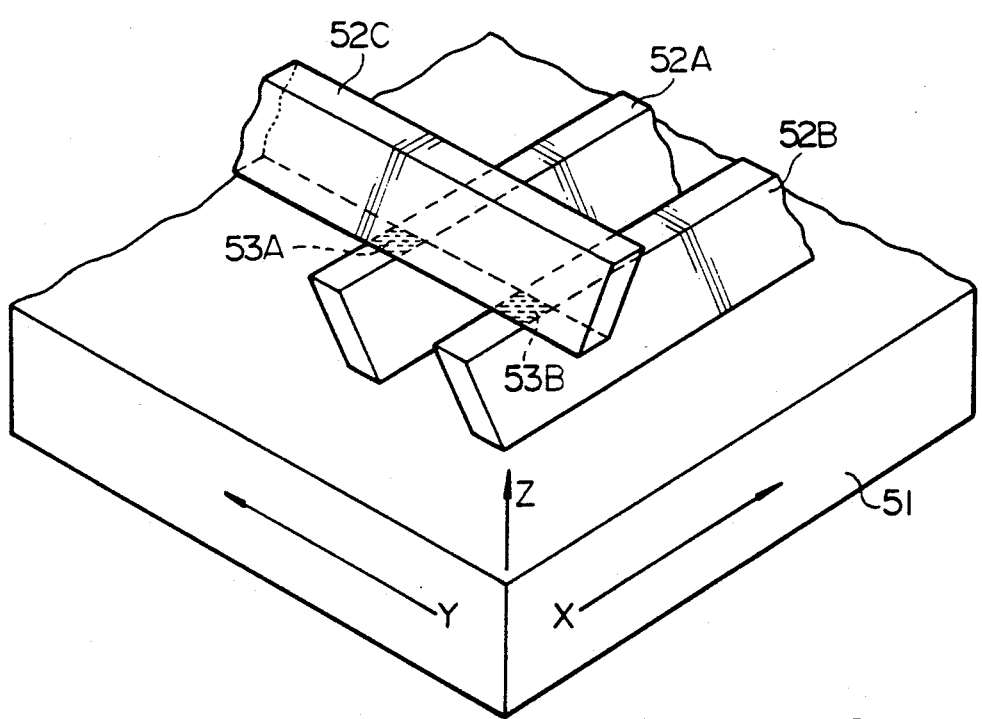
FIG. 6 is a perspective view showing the structure of another superconducting three terminal device according to the present invention.

Turning to FIG. 6 of the drawings, another superconducting three terminal device embodying the present invention is fabricated on a silicon substrate 51, and the superconducting three terminal device is embedded into an insulating film in an actual structure; however, the insulating film is removed from the silicon substrate as similar to the first embodiment. X, Y and Z designate respective axes of the coordinate defined for the silicon substrate 51.

The superconducting three terminal device shown in FIG. 6 is similar to that shown in FIG. 4 with the exception of the inclinations of three electrodes with respect to the silicon substrate, and, for this reason, description is focused upon the three electrodes only. The first and second signal output electrodes 52A and 52B extend in directions substantially parallel to the axis X, and are declined at about 30 degrees from a perpendicular plane in a direction substantially parallel to the axis Y. The base electrode 52C extends in a direction substantially parallel to the axis Y, and is declined at about 30 degrees from a perpendicular plane in a direction substantially parallel to the axis Y. Then, first and second signal output electrodes 52A and 52B and the gate electrode 52C are coplanar with respective virtual planes extending from the major surface of the silicon substrate 50 at about 60 degrees. However, the virtual planes may decline from the major surface of the silicon substrate 50 at 60 degrees to 90 degrees. Two ultra small tunnel junctions 53A and 53B take place at respective contact areas between the first and second signal output electrodes 52A and 52B and the base electrode 52C, and is indicated by hatching.

A process sequence for fabricating the superconducting three terminal device shown in FIG. 6 is similar to that shown in FIGS. 5A to 5F with the exception of the steps of shaping insulating blocks which correspond to the insulating blocks 32A to 32C and 42A to 42B. The insulating blocks are shaped into trapezoids so that oblique side surfaces take place on both sides of each insulating block. Such oblique side surfaces are formed by using various technique, and an isotropic etching may be available for formation of the oblique side surfaces.

Figure 7:
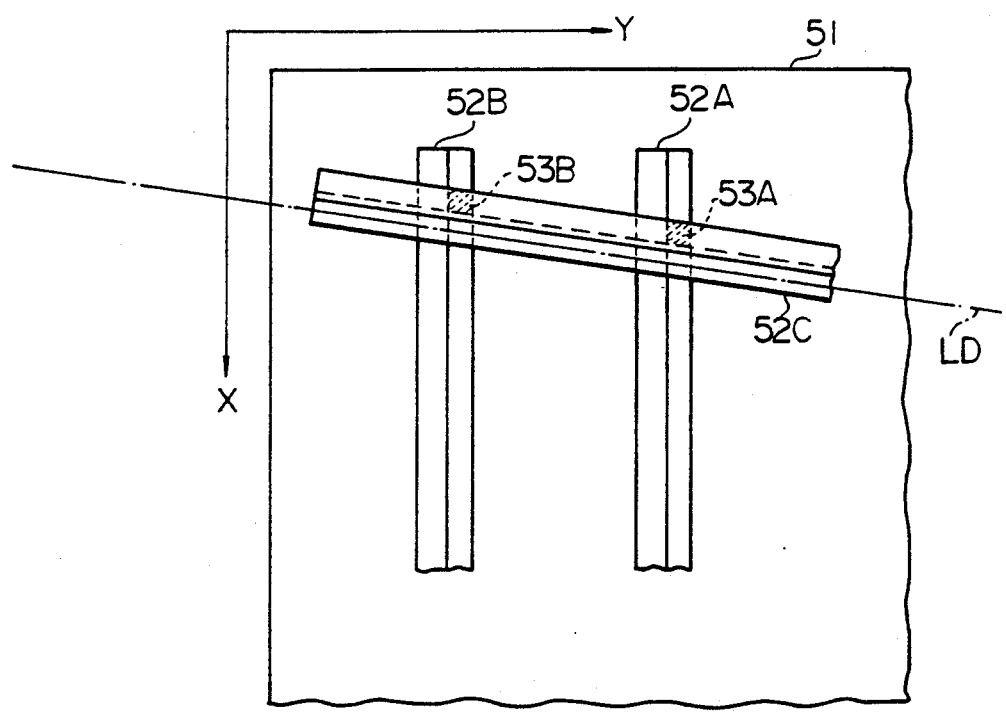
FIG. 7 is a plan view showing a modification of the superconducting three terminal device shown in FIG. 4 or 6.

In the first and second embodiments, the longitudinal direction of each base electrodes 22C or 52C extends substantially parallel to the Y axis, and the longitudinal direction of each signal output electrode 22A, 22B, 52A or 52B extends substantially in parallel to the X axis. However, if the longitudinal direction LD of the base electrode LD is oblique with respect to the X axis and, accordingly, the longitudinal directions of the signal output electrodes 52A and 52B as shown in FIG. 7, the ultra small tunnel junctions 53A and 53B are increased due to increment of the base. Thus, the ultra small tunnel junctions are variable in area by changing the angle between the longitudinal direction of the base electrode 52C and the longitudinal directions of the signal output electrodes 52A and 52B. In other words, a designer can regulate the amount of area of each ultra small tunnel junction 53A or 53B by changing the angle.

Although particular embodiments of the present invention have been shown and described, it will be obvious to those skilled in the art that various changes and modifications may be made without departing from the spirit and scope of the present invention. For example, niobium is utilized as the superconductor, however, another metal superconductor such as, for example, an aluminum is available. Moreover, oxide superconductors such as an yttrium-barium-copper oxide are available for the electrodes. Moreover, the side surfaces of the superconducting strips extend at right angle or 60 degrees with respect to the major surface of the silicon substrate, however, the side surfaces may extend at any finite angle with respect to the major surface of the substrate depending upon the location of each small tunnel junction. The silicon substrate is utilized in the above described embodiment, however, another substrate either insulating or semiconductor substance is available in another implementation.

What is claimed is:

1. A superconducting three terminal device fabricated on a substrate, said substrate having a major surface, comprising
   a) first and second output signal electrodes formed of a superconductor and spaced apart from each other at a spacing, said first and second output signal electrodes having respective side surfaces and respective top edges, said first and second output signal electrodes being formed on said major surface, and
   b) a base electrode formed of a superconductor and contacted to the top edges of said first and second output signal electrodes so that small tunnel junctions take place between the base electrode and said first and second output signal electrodes, said base electrode having a side surface, said superconductor being selected from the group consisting of niobium and aluminum, each of said small tunnel junctions having a static electric energy represented as $e^2/2C$ greater than a Josephson energy $k_B T$ where e is the charge of an electron, C is the capacitance produced at said small junction, Ic is a critical current at said small junction, h is the Planck constant, T is a temperature of said small junction and $k_B$ is the Boltzmann constant, said capacitance produced at said each of said small junctions being larger than a certain value produced at a junction between said base electrode and said first or second output electrode when each of said electrodes is substantially as small as but not smaller than a coherence length in said superconductor, in which said first output signal electrode is grown in a first direction coincident with a thickness of said first output signal electrode, said second output signal electrode is grown in a second direction coincident with a thickness of said second output signal electrode, and said base electrode is grown in a third direction coincident with a thickness of said base electrode, and in which the side surfaces of said first and second output signal electrodes and said base electrode are substantially perpendicular to said first, second and third directions, respectively, wherein the side surfaces of said first and second output signal electrodes and the side surface of said base electrode are coplanar with respective virtual planes extending at respective angles with respect to the major surface of said substrate, said angles being less than 90 degrees.

2. A superconducting three terminal device as set forth in claim 1, in which said first and second signal output electrodes and said base electrode have respective longitudinal directions and in which the longitudinal direction of said base electrode extends on a plane which intersects the longitudinal directions of said first and second signal output electrodes at respective predetermined angles.

3. A superconducting three terminal device as set forth in claim 2, in which said respective angles are approximately equal to 90 degrees.

4. A superconducting three terminal device as set forth in claim 2, in which said predetermined angles are approximately equal to 90 degrees.

5. A superconducting three terminal device as set forth in claim 2, in which said respective angles are approximately equal to 60 degrees.

6. A superconducting three terminal device as set forth in claim 5, in which said predetermined angles are approximately equal to 90 degrees.

* * * * *